(12) United States Patent
Yasuda (10) Patent No.: US 11,387,400 B2
(45) Date of Patent: Jul. 12, 2022

(54) ELECTRONIC MODULE WITH SEALING RESIN

(71) Applicant: Murata Manufacturing Co., Ltd., Nagaokakyo (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 309 days.

(21) Appl. No.: 16/034,385

(22) Filed: Jul. 13, 2018

(65) Prior Publication Data
US 2019/0027676 A1    Jan. 24, 2019

(30) Foreign Application Priority Data

Jul. 19, 2017 (JP) .............................. JP2017-139548
Apr. 21, 2018 (JP) .............................. JP2018-081931

(51) Int. Cl.
*H01L 41/053* (2006.01)
*H01L 23/00* (2006.01)
(Continued)

(52) U.S. Cl.
CPC ........ *H01L 41/0533* (2013.01); *H01L 21/565* (2013.01); *H01L 23/295* (2013.01); *H01L 23/3121* (2013.01); *H01L 23/552* (2013.01); *H01L 24/06* (2013.01); *H01L 24/14* (2013.01); *H01L 41/0475* (2013.01); *H01L 41/0477* (2013.01); *H01L 41/25* (2013.01); *H03H 9/0542* (2013.01); *H03H 9/0552* (2013.01); *H03H 9/1071* (2013.01); *H01L 23/145* (2013.01); *H01L 23/15* (2013.01); *H01L 23/49811* (2013.01); *H01L 25/16* (2013.01); *H01L 2224/0401* (2013.01);
(Continued)

(58) Field of Classification Search
CPC ........................... H01L 21/565; H01L 41/0533
See application file for complete search history.

(56) References Cited

U.S. PATENT DOCUMENTS 9,054,077 B2 * 6/2015 Lim .................... H01L 23/4334
2006/0103028 A1 * 5/2006 Hazeyama ............ H01L 21/563
257/778
(Continued)

FOREIGN PATENT DOCUMENTS

JP     2006-74587 A    3/2006
JP     2012-28510 A    2/2012
(Continued)

*Primary Examiner* — Matthew C Landau
*Assistant Examiner* — Mark Hatzilambrou
(74) *Attorney, Agent, or Firm* — Keating & Bennett, LLP (57) ABSTRACT

An electronic module includes a substrate that includes a first main surface and a second main surface, at least one first electronic component that includes electrodes on a mounting surface thereof on the substrate and that includes a hollow portion, at least one second electronic component that includes electrodes on a mounting surface thereof on the substrate and that includes no hollow portion, and a sealing resin. The at least one first electronic component is mounted on the first main surface of the substrate and sealed with the sealing resin. The at least one second electronic component is mounted on the second main surface of the substrate and is not sealed with the sealing resin.

19 Claims, 6 Drawing Sheets

(51) Int. Cl.

| | | |
|---|---|---|
| *H01L 23/31* | (2006.01) | |
| *H01L 23/29* | (2006.01) | |
| *H01L 41/047* | (2006.01) | |
| *H03H 9/05* | (2006.01) | |
| *H03H 9/10* | (2006.01) | |
| *H01L 25/16* | (2006.01) | |
| *H01L 23/14* | (2006.01) | |
| *H01L 23/15* | (2006.01) | |
| *H01L 23/498* | (2006.01) | |
| *H01L 23/552* | (2006.01) | |
| *H01L 41/25* | (2013.01) | |
| *H01L 21/56* | (2006.01) | |

(52) U.S. Cl.
CPC ............... *H01L 2224/05647* (2013.01); *H01L 2224/05655* (2013.01); *H01L 2224/0612* (2013.01); *H01L 2224/08225* (2013.01); *H01L 2224/13144* (2013.01); *H01L 2224/1412* (2013.01); *H01L 2224/16227* (2013.01); *H01L 2224/8085* (2013.01); *H01L 2224/80801* (2013.01); *H01L 2224/8185* (2013.01); *H01L 2224/81801* (2013.01); *H01L 2924/181* (2013.01); *H01L 2924/19105* (2013.01); *H01L 2924/3025* (2013.01)

(56) References Cited

U.S. PATENT DOCUMENTS

| | | | |
|---|---|---|---|
| 2011/0249416 A1* | 10/2011 | Takai | H05K 3/284 |
| | | | 361/760 |
| 2012/0018906 A1 | 1/2012 | Mino et al. | |
| 2015/0200034 A1* | 7/2015 | Aliane | H01L 23/49827 |
| | | | 174/257 |
| 2016/0060450 A1* | 3/2016 | Toyoda | H03H 9/1085 |
| | | | 156/60 |
| 2016/0225745 A1* | 8/2016 | Beer | H01L 25/0657 |
| 2016/0277003 A1 | 9/2016 | Kikuchi et al. | |

FOREIGN PATENT DOCUMENTS

| | | |
|---|---|---|
| WO | 2014/017159 A1 | 1/2014 |
| WO | 2015/098678 A1 | 7/2015 |

* cited by examiner

ELECTRONIC MODULE WITH SEALING RESIN

CROSS REFERENCE TO RELATED APPLICATIONS

This application claims the benefit of priority to Japanese Patent Application No. 2017-139548 filed on Jul. 19, 2017 and Japanese Patent Application No. 2018-081931 filed on Apr. 21, 2018. The entire contents of these applications are hereby incorporated herein by reference.

BACKGROUND OF THE INVENTION

1. Field of the Invention

The present invention relates to an electronic module including electronic components that are mounted on a substrate.

2. Description of the Related Art

Figure 6:
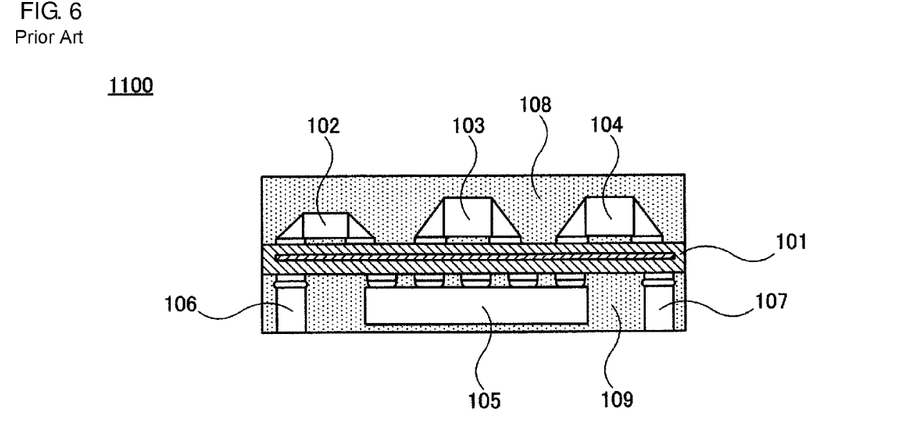
FIG. 6 is a sectional view of an electronic module that is disclosed in WO2014/017159A1.

Electronic modules including electronic components that are mounted on a substrate are widely used for various electronic devices. FIG. 6 illustrates an electronic module 1100 that is disclosed in International Publication No. WO2014/017159A1 as an example.

The electronic module 1100 includes electronic components (chip components) 102, 103, and 104 in the form of chips, and each electronic component is obtained by forming electrodes at both ends of a capacitor, an inductor, or a resistor and is mounted on one main surface of a substrate (wiring substrate) 101. A semiconductor device (semiconductor substrate) 105 is mounted on the other main surface of the substrate 101, and electrodes are formed on a mounting surface of the semiconductor device 105.

The electronic components 102, 103, and 104 are sealed with a sealing resin (resin layer) 108. The semiconductor device 105 is sealed with a sealing resin 109.

The sealing resin 108 and the sealing resin 109 that are the same kind of resin are formed on the one main surface and the other main surface of the substrate (wiring substrate) 101 of the electronic module 1100. The sealing resin 108 and the sealing resin 109 may have different coefficients of linear expansion to inhibit a warp of the electronic module 1100 when the electronic module 1100 greatly warps.

Figure 7:
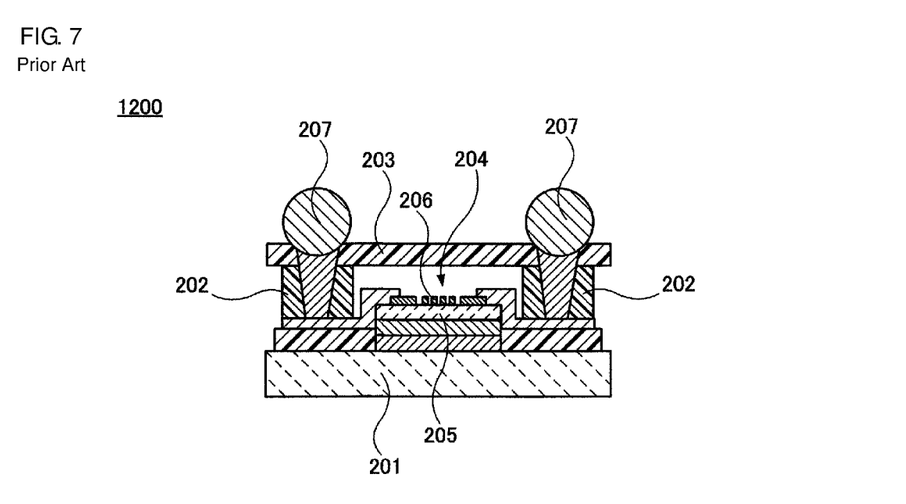
FIG. 7 is a sectional view of an elastic wave device that is disclosed in WO2015/098678A1.

Elastic wave devices that use a SAW (Surface Acoustic Wave) or a BAW (Bulk Acoustic Wave) are widely used as resonators or filters of electronic devices, such as mobile communication devices. FIG. 7 illustrates an elastic wave device 1200 that is disclosed in International Publication No. WO2015/098678A1 as an example.

The elastic wave device 1200 includes a hollow portion 204 that is surrounded by components, such as a substrate (support substrate) 201, support member 202, and a lid 203.

In the elastic wave device 1200, a piezoelectric thin film 205 is formed in the hollow portion 204, and interdigital transducer electrode 206 are formed on the piezoelectric thin film 205. The hollow portion 204 is formed so that the interdigital transducer electrode 206 are not hindered from vibrating.

In the electronic module 1100, the semiconductor device 105 and the electronic components 102, 103, and 104 in the form of chips, such as a capacitor, an inductor, or a resistor, are mounted on the substrate 101. In some cases, in the electronic module 1100, an additional electronic component including a hollow portion is preferably mounted on the substrate 101 as in the elastic wave device 1200 to increase functionality.

However, when a semiconductor device and an electronic component including a hollow portion are mounted on a substrate, there is the following problem.

In some cases, the electronic component including the hollow portion as in the elastic wave device 1200 is liquid-tight but is not completely air tight, and it is necessary to improve humidity resistance in a manner in which the electronic component is sealed with a sealing resin, which keeps air having high humidity from entering the hollow portion.

The use of a sealing resin that has low liquidity when the sealing resin is uncured is required to seal the electronic component including the hollow portion as in the elastic wave device 1200. The reason for this is that there is a risk that the use of a sealing resin that has high liquidity when the sealing resin is uncured causes the hollow portion to be crushed due to the pressure of the sealing resin when the sealing resin is formed around the electronic component including the hollow portion.

In the semiconductor device, which includes the electrodes that are formed on the mounting surface, the pitches between the electrodes are typically very narrow. Accordingly, there is a risk that the use of a sealing resin that has low liquidity when the sealing resin is uncured to seal the semiconductor device causes the formation of a gap in one of spaces between the electrodes on the mounting surface of the semiconductor device because the spaces are not sufficiently filled with the sealing resin. A state in which the sealing resin is uncured is suitable to seal the electronic component including the hollow portion. When the electronic module is mounted on, for example, a substrate of an electronic device by, for example, reflow soldering, solder that is used to mount the semiconductor device on the substrate is melted again due to heat, expands, and enters the gap that is formed in the sealing resin between the electrodes of the semiconductor device. In this case, there is a risk that the solder that has entered the gap causes a short circuit between the electrodes of the semiconductor device, that is, a phenomenon called a solder flash occurs.

Whether the electronic components need the sealing resin and the degree of liquidity the sealing resin that is uncured needs to have differ between the electronic components as described above. Accordingly, when an electronic component (such as the elastic wave device) including the hollow portion and an electronic component (such as the semiconductor device) that has very narrow pitches between electrodes formed on the mounting surface and that includes no hollow portion are mounted on the substrate and sealed with the same sealing resin, there are the following problems.

In the case in which the sealing resin that has high liquidity when uncured is used to sufficiently fill the spaces between the electrodes of the electronic component including no hollow portion and to inhibit a gap from being formed in the sealing resin between the electrodes, there is a risk that the hollow portion of the electronic component including the hollow portion is crushed due to the pressure when the sealing resin is filled.

In the case in which the sealing resin that has low liquidity when uncured is used to inhibit the hollow portion of the electronic component including the hollow portion from being crushed due to the pressure when the sealing resin is filled, the spaces between the electrodes of the electronic component including no hollow portion are not sufficiently filled with the sealing resin, and there is a risk that a gap is formed in the sealing resin between the electrodes and causes the solder flash.

SUMMARY OF THE INVENTION

Preferred embodiments of the present invention provide electronic modules each including electronic components that are mounted on a substrate.

According to a preferred embodiment of the present invention, an electronic module includes a substrate that includes a first main surface and a second main surface, at least one first electronic component that includes electrodes provided on a mounting surface thereof on the substrate and that includes a hollow portion, at least one second electronic component that includes electrodes provided on a mounting surface thereof on the substrate and that includes no hollow portion, and a sealing resin. The at least one first electronic component is mounted on the first main surface of the substrate and sealed with the sealing resin. The at least one second electronic component has a narrowest pitch between the electrodes that are provided on the mounting surface and is mounted on the second main surface of the substrate, and at least a portion of the at least one second electronic component that is joined to the substrate is not sealed with the sealing resin.

The sealing resin preferably includes a filler. In this case, the liquidity of the sealing resin that is uncured decreases, and the hollow portion of the at least one first electronic component is prevented from being crushed due to the pressure when the sealing resin is filled. In addition, the humidity resistance of the sealing resin that includes the filler and that is cured is typically improved, and water is prevented from entering the hollow portion of the at least one first electronic component with more certainty.

An outer electrode that is made of a metal piece is preferably mounted on the second main surface of the substrate.

An example of the at least one first electronic component is an elastic wave device that uses, for example, a SAW or a BAW.

The at least one second electronic component that has the narrowest pitch between the electrodes that are provided on the mounting surface preferably includes an exterior resin that defines outer surfaces thereof. In this case, the exterior resin enables the humidity resistance and strength of the at least one second electronic component to be maintained without sealing the at least one second electronic component with a new sealing resin.

An example of the at least one second electronic component that has the narrowest pitch between the electrodes that are provided on the mounting surface is a semiconductor device.

A shield electrode is preferably provided on at least a portion of an outer surface of the sealing resin. In this case, the shield electrode prevents the electronic component (such as the at least one first electronic component) that is sealed with the sealing resin from being adversely affected by a noise from the outside and prevents the electronic component that is sealed with the sealing resin from emitting a noise to the outside. The shield electrode also prevents water from entering the inside of the sealing resin and prevents water from entering the hollow portion of the at least one first electronic component with more certainty.

According to preferred embodiments of the present invention, a sealing resin that has low liquidity when uncured is able to be used as the sealing resin of the electronic module, and the hollow portion of the at least one first electronic component is unlikely to be crushed due to the pressure when the sealing resin is filled. A state in which the sealing resin is uncured is suitable to seal the at least one first electronic component. According to preferred embodiments of the present invention, since the at least one first electronic component of the electronic module is sealed with the sealing resin, water is unlikely to enter the hollow portion of the at least one first electronic component. According to preferred embodiments of the present invention, the at least one second electronic component of the electronic module that has the narrowest pitch between the electrodes that are provided on the mounting surface is not sealed with the sealing resin. Accordingly, when the electronic module is mounted on, for example, a substrate of an electronic device by, for example, reflow soldering, no solder flash occurs even when solder that is used to mount the at least one second electronic component is melted again due to heat.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described with reference to the drawings.

The preferred embodiments will be described by way of examples as preferred embodiments of the present invention, and the present invention is not limited to the preferred embodiments. The contents described according to the preferred embodiments may be combined and included in the present invention. The drawings assist in understanding the preferred embodiments and are schematically illustrated in some cases. In some cases, the ratio of dimensions of a component or between components in the drawings does not match the ratio of the dimensions thereof in the description. In some cases, a component in the description is omitted in the drawings, and the number thereof is omitted in the drawings.

First Preferred Embodiment

Figure 1:
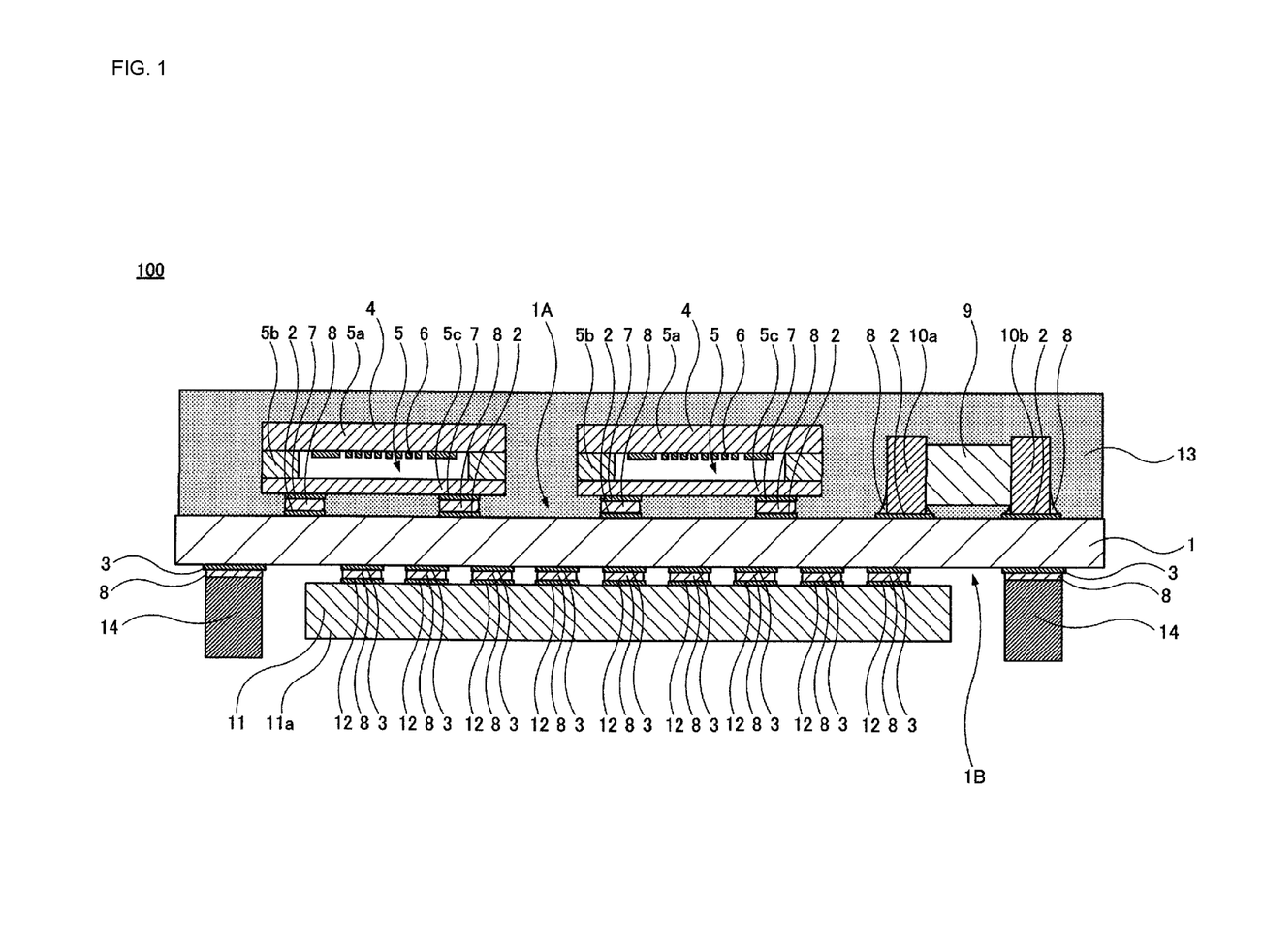
FIG. 1 is a sectional view of an electronic module according to a first preferred embodiment of the present invention.

FIG. 1 illustrates an electronic module 100 according to a first preferred embodiment of the present invention. FIG. 1 is a sectional view of the electronic module 100.

The electronic module 100 includes a substrate 1. The material of the substrate 1 is not limited. For example, a resin substrate that is made of, for example, PCB (Poly Chlorinated Biphenyl) or a ceramics substrate that is made of, for example, LTCC (Low Temperature Co-Fired Ceramics) may preferably be used. The structure of the substrate 1 is not limited, and the substrate may be a multilayer substrate or a single-layer substrate.

The substrate 1 includes a first main surface 1A on the upper side in FIG. 1 and a second main surface 1B on the lower side in FIG. 1. Electrodes 2 are provided on the first main surface 1A. Electrodes 3 are provided on the second main surface 1B. The materials of the electrodes 2 and 3 are not limited, and preferred examples thereof include copper and silver. The surfaces of the electrodes 2 and 3 are plated with tin or solder in some cases.

In the substrate 1, via electrodes, or via electrodes and wiring electrodes are preferably made of, for example, copper to define inner wiring although this is not illustrated. The inner wiring connects the electrodes 2 provided on the first main surface 1A of the substrate 1 and the electrodes 3 provided on the second main surface 1B to each other.

Two first electronic components 4 each of which includes a hollow portion 5 are mounted on the first main surface 1A of the substrate 1. According to the present preferred embodiment, each first electronic component 4 is preferably an elastic wave device that uses a SAW, for example. However, the type of each first electronic component 4 is not limited, and may be an elastic wave device that uses a BAW, instead of the elastic wave device that use a SAW or may be an electronic component other than the elastic wave devices.

Each first electronic component 4 includes the hollow portion 5 that is defined by a piezoelectric substrate 5a, a support member 5b, and a lid 5c. Interdigital transducer electrodes 6 are provided on the piezoelectric substrate 5a in the hollow portion 5. The hollow portion 5 of each first electronic component 4 is structured so that the interdigital transducer electrodes 6 are not hindered or prevented from vibrating. In the description, the hollow portion is a closed space that is intentionally provided and does not correspond to, for example, a gap that is unintentionally provided by air that has entered resin in a manufacturing process. In some cases, the hollow portion 5 of each first electronic component 4 is liquid-tight but is not completely air tight. The height of each first electronic component 4, such as the elastic wave device that uses a SAW (or a BAW), tends to increase because of the formation of the hollow portion 5, and the thickness of the lid 5c needs to be decreased as much as possible to decrease the height. Consequently, humidity resistance decreases in some cases. Accordingly, it is necessary to improve the humidity resistance of each first electronic component 4 by using a sealing resin, which keeps air having high humidity from entering the hollow portion 5.

Each first electronic component 4 includes electrodes 7 that are provided on a mounting surface. The material of each electrode 7 is not limited, and preferred examples thereof include Cu and Ni. The pitches between the electrodes 7 are sufficiently wide. The pitch between the electrodes 7 that are closest to each other is preferably, for example, about 0.3 mm. The electrodes 7 may not be electrodes that are made of a metal film but may be bump electrodes, such as gold bumps.

The electrodes 7 that are provided on the mounting surfaces of the first electronic components 4 are joined to the corresponding electrodes 2 that are provided on the first main surface 1A of the substrate 1 preferably using solder 8, for example. The electrodes 7 and the electrodes 2 may be joined to each other using a conductive adhesive, instead of the solder 8. According to the present preferred embodiment, the two first electronic components 4 are mounted on the first main surface 1A of the substrate 1.

A second electronic component 9 defined by a chip component includes no hollow portion and is mounted on the first main surface 1A of the substrate 1. Preferred examples of the second electronic component 9 include a capacitor, an inductor, and a resistor. Electrodes 10a and 10b are provided at both ends of the second electronic component 9. The pitch between the electrodes 10a and 10b is sufficiently wide and is preferably, for example, about 0.3 mm.

The electrodes 10a and 10b of the second electronic component 9 are joined to the corresponding electrodes 2 that are provided on the first main surface 1A of the substrate 1 preferably using the solder 8, for example. The electrodes 10a and 10b and the electrodes 2 may be joined to each other using a conductive adhesive, instead of the solder 8. The second electronic component 9 includes no hollow portion and no electrodes that are provided on the mounting surface of the second electronic component 9, and thus has no pitch between electrodes that are provided on the mounting surface (does not correspond to a "second electronic component that has the narrowest pitch between the electrodes that are formed on the mounting surface").

A second electronic component 11 that includes no hollow portion is mounted on the second main surface 1B of the substrate 1. According to the present preferred embodiment, the second electronic component 11 is preferably a semiconductor device, for example. The outer surfaces of the second electronic component 11 are made of an exterior resin 11a. That is, the main body (for example, a semiconductor substrate, not illustrated) of the second electronic component 11 is sealed with the exterior resin 11a.

Electrodes 12 are provided on the mounting surface of the second electronic component 11. The material of each electrode 12 is not limited, and preferred examples thereof include Cu. The pitches between the electrodes 12 that are provided on the mounting surface of the second electronic component 11 are narrower than the pitches between the electrodes that are provided on the mounting surface of the other second electronic component. The pitch between the electrodes 12 that are closest to each other is preferably, for example, about 150 μm. The electrodes 12 may not be electrodes that are made of a metal film but may be bump electrodes, such as gold bumps, for example.

The electrodes 12 that are provided on the mounting surface of the second electronic component 11 are joined to the electrodes 3 that are provided on the second main surface 1B of the substrate 1 preferably using the solder 8, for example. The electrodes 12 and the electrodes 3 may be joined to each other using a conductive adhesive instead of the solder 8.

The first electronic components 4 and the second electronic component 9 defined by chip components that are mounted on the first main surface 1A of the substrate 1 are sealed with a sealing resin 13.

A resin that has low liquidity when uncured and high humidity resistance when cured is used as the sealing resin 13. The reason that the resin having low liquidity when uncured is used as the sealing resin 13 is to prevent the hollow portion 5 of each first electronic component 4 from being crushed due to the pressure of the sealing resin 13 when the sealing resin 13 is formed. The reason that the resin having high humidity resistance when cured is used as the sealing resin 13 is to prevent water from entering the hollow portion 5 of each first electronic component 4 that is sealed with the sealing resin 13.

According to the present preferred embodiment, the sealing resin 13 is preferably an epoxy resin, for example, as a base material, that includes powder of silica having an average particle diameter of about 30 μm in an amount of about 80% by volume as a filler.

The included filler typically decreases the liquidity of the sealing resin that is uncured. The filler blocks a passage through which water passes in the sealing resin. The humidity resistance of the sealing resin that is cured typically increases as the amount of the filler increases.

According to the present preferred embodiment, since the sealing resin 13 includes powder of silica having an average particle diameter of about 30 μm in an amount of about 80% by volume as the filler as described above, the sealing resin 13 has low liquidity when uncured and has high humidity resistance when cured. The liquidity of the sealing resin 13 that is uncured and the humidity resistance of the sealing resin 13 that is cured is able to be adjusted in a manner in which the amount of the included filler or the average particle diameter thereof is adjusted.

The type of the base material of the sealing resin 13 is not limited, and the base material may be a silicone resin or an acrylic resin, for example, instead of an epoxy resin. The material of the filler is not limited and may be, for example, alumina, boron nitride, or a composite material thereof, instead of silica.

The height of each first electronic component 4, such as the elastic wave device that uses a SAW (or a BAW), tends to increase because of the formation of the hollow portion 5, and the thickness of the lid 5c needs to be decreased as much as possible to decrease the height, as described above. Consequently, the humidity resistance of each first electronic component 4 decreases in some cases. Accordingly, it is necessary to improve the humidity resistance by using the sealing resin 13.

The second electronic component 11 that is mounted on the second main surface 1B of the substrate 1 is not sealed with the sealing resin. The second electronic component 11 includes no hollow portion, as described above, and has sufficient humidity resistance and strength without being sealed with the sealing resin.

Outer electrodes 14 each of which is made of a metal piece are mounted on the second main surface 1B of the substrate 1. Specifically, the outer electrodes 14 are joined to the corresponding electrodes 3 that are provided on the second main surface 1B of the substrate 1 preferably using the solder 8, for example. According to the present preferred embodiment, the material of each outer electrode 14 is preferably, Cu, for example. The shape of each outer electrode 14 is preferably columnar or substantially columnar, for example. However, the material and shape of each outer electrode 14 are not limited, and the outer electrode 14 may be made of a metal other than Cu and may have a shape other than a columnar or substantially columnar shape. The height of each outer electrode 14 is preferably greater than the height of the second electronic component 11. The outer electrodes 14 may be mounted using a conductive adhesive, for example, instead of the solder 8.

In the electronic module 100 having the above-described structure, the hollow portion 5 of each first electronic component 4 is unlikely to be crushed due to the pressure when the sealing resin 13 is filled because the sealing resin that has low liquidity when uncured is used as the sealing resin 13. A state in which the sealing resin is uncured is suitable to seal the first electronic components 4.

Since the first electronic components 4 of the electronic module 100 according to the present preferred embodiment are sealed with the sealing resin 13, water is unlikely to enter the hollow portion 5 of each first electronic component 4.

Of the second electronic components of the electronic module 100 according to the present preferred embodiment, the second electronic component 11 that has the narrowest pitch between the electrodes that are provided on the mounting surface is not sealed with the sealing resin. Accordingly, when the electronic module 100 is mounted on, for example, a substrate of an electronic device by, for example, reflow soldering, no solder flash occurs even when the solder 8 that is used to mount the second electronic component 11 on the substrate 1 is melted again due to heat.

The electronic module 100 having the above-described structure according to the first preferred embodiment may be manufactured by, for example, a method described below. In actual manufacturing processes, a large number of the electronic modules 100 are collectively manufactured in a manner in which a mother substrate is divided into the individual electronic modules during the processes. In the following description, however, the single electronic module 100 is manufactured for convenience of description.

Figure 2A:
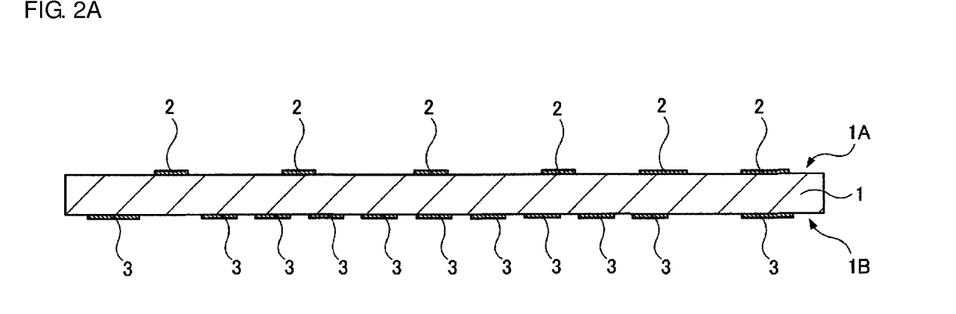
FIGS. 2A to 2C illustrate processes that are performed in an example of a method of manufacturing the electronic module according to a preferred embodiment of the present invention with sectional views.

As illustrated in FIG. 2A, the substrate 1 is prepared. In the substrate 1, the electrodes 2 are formed on the first main surface 1A, the electrodes 3 are formed on the second main surface 1B, and inner wiring (not illustrated) to connect the electrodes 2 and the electrodes 3 to each other is formed in advance.

Figure 2B:
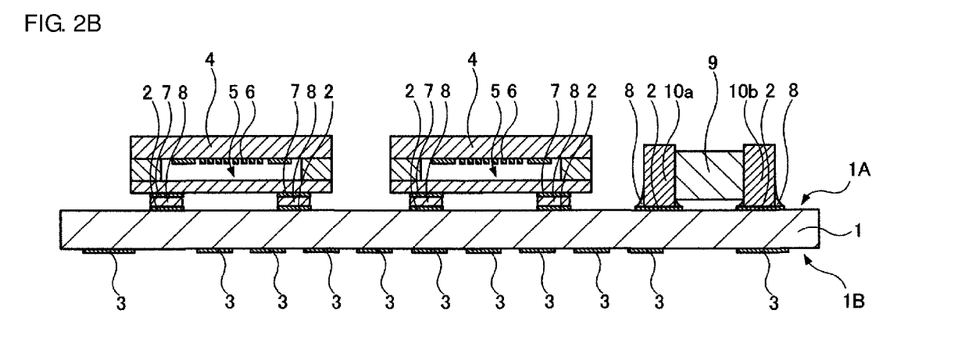

Subsequently, as illustrated in FIG. 2B, the first electronic components 4 and the second electronic component 9 are mounted on the electrodes 2 on the first main surface 1A of the substrate 1. Specifically, a solder paste is first applied to the electrodes 2. Subsequently, the electrodes 7 of the first electronic components 4 and the electrodes 10a and 10b of the second electronic component 9 are disposed above the electrodes 2 to which the solder paste is applied. Subsequently, the solder paste is melted by being heated, and cooled to form the solder 8, and the electrodes 7 of the first electronic components 4 and the electrodes 10a and 10b of the second electronic component 9 are joined to the electrodes 2 that are formed on the first main surface 1A of the substrate 1.

Figure 2C:
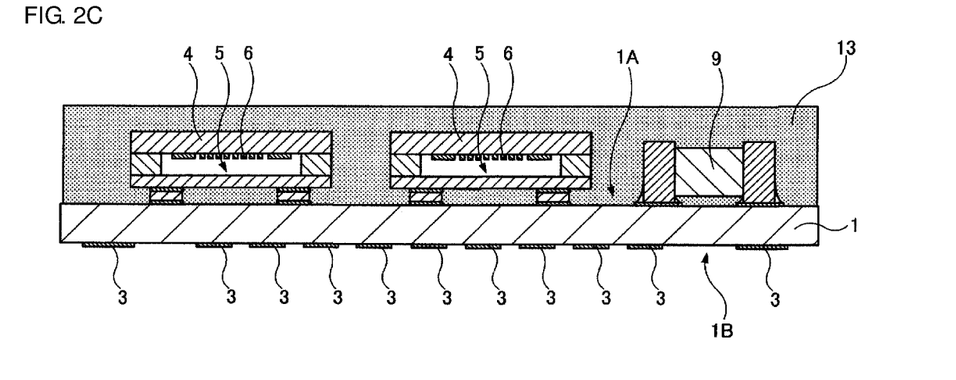

Subsequently, as illustrated in FIG. 2C, the first electronic components 4 and the second electronic component 9 that are mounted on the first main surface 1A of the substrate 1 are sealed with the sealing resin 13. Specifically, a space around the first electronic components 4 and the second electronic component 9 is first filled with the sealing resin 13 that is uncured. Subsequently, the sealing resin 13 is cured by being heated, irradiated with light, or heated and irradiated with light. Since the sealing resin 13 has low liquidity when uncured, the hollow portion 5 of each first electronic component 4 is not crushed due to the pressure when the sealing resin 13 is filled.

Figure 3D:
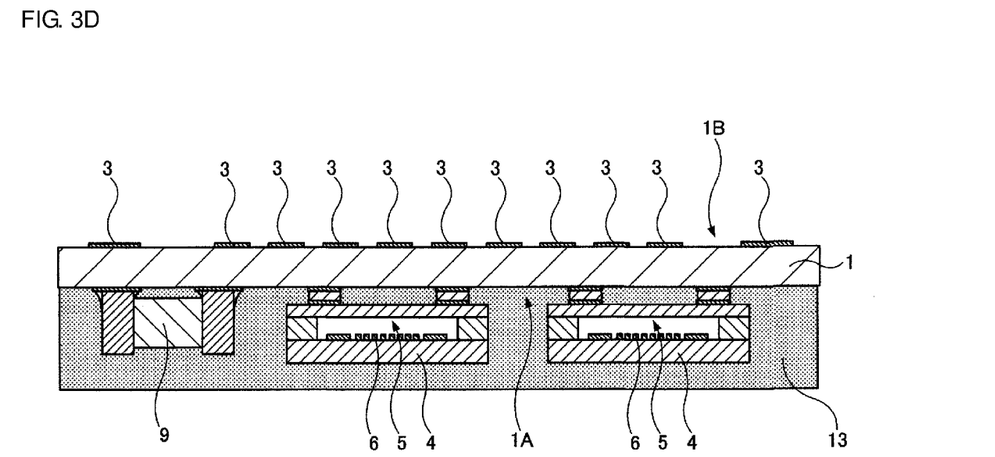
FIGS. 3D and 3E illustrate processes subsequent to that in FIG. 2C that are performed in the example of the method of manufacturing the electronic module with sectional views.

Subsequently, as illustrated in FIG. 3D, the substrate 1 is turned upside down. Specifically, the substrate 1 is turned such that the first main surface 1A of the substrate 1 faces the lower side, and the second main surface 1B of the substrate 1 faces the upper side.

Figure 3E:
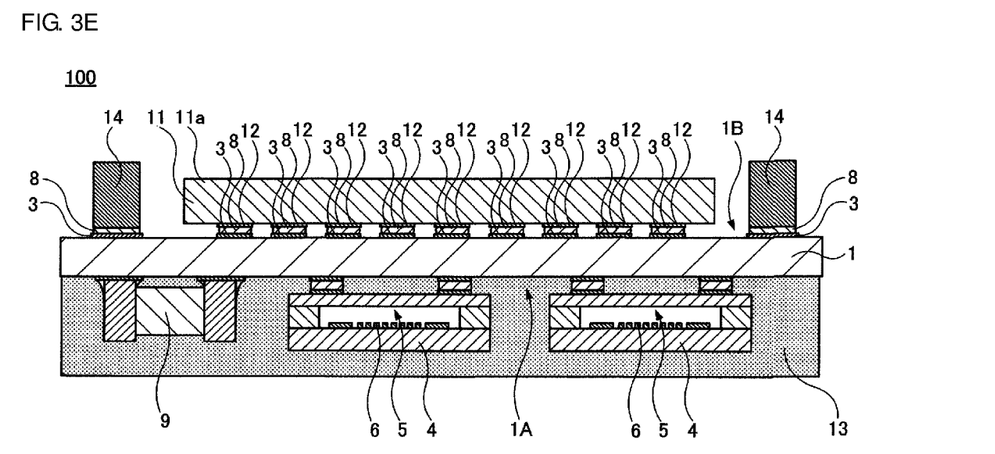

Subsequently, as illustrated in FIG. 3E, the second electronic component 11 and the outer electrodes 14 are mounted on the second main surface 1B of the substrate 1. Specifically, a solder paste is applied to the electrodes 3 that are formed on the second main surface 1B of the substrate 1. Subsequently, the electrodes 12 of the second electronic component 11 are disposed above the corresponding electrodes 3 to which the solder paste is applied. The outer electrodes 14, each of which is formed of the metal piece, are disposed above the other electrodes 3 to which the solder paste is applied. Subsequently, the solder paste is melted by being heated and cooled to form the solder 8, the electrodes 12 of the second electronic component 11 are joined to the electrodes 3, and the outer electrodes 14 are joined to the electrodes 3.

Through the above-described processes, the electronic module 100 is completed.

Second Preferred Embodiment

Figure 4:
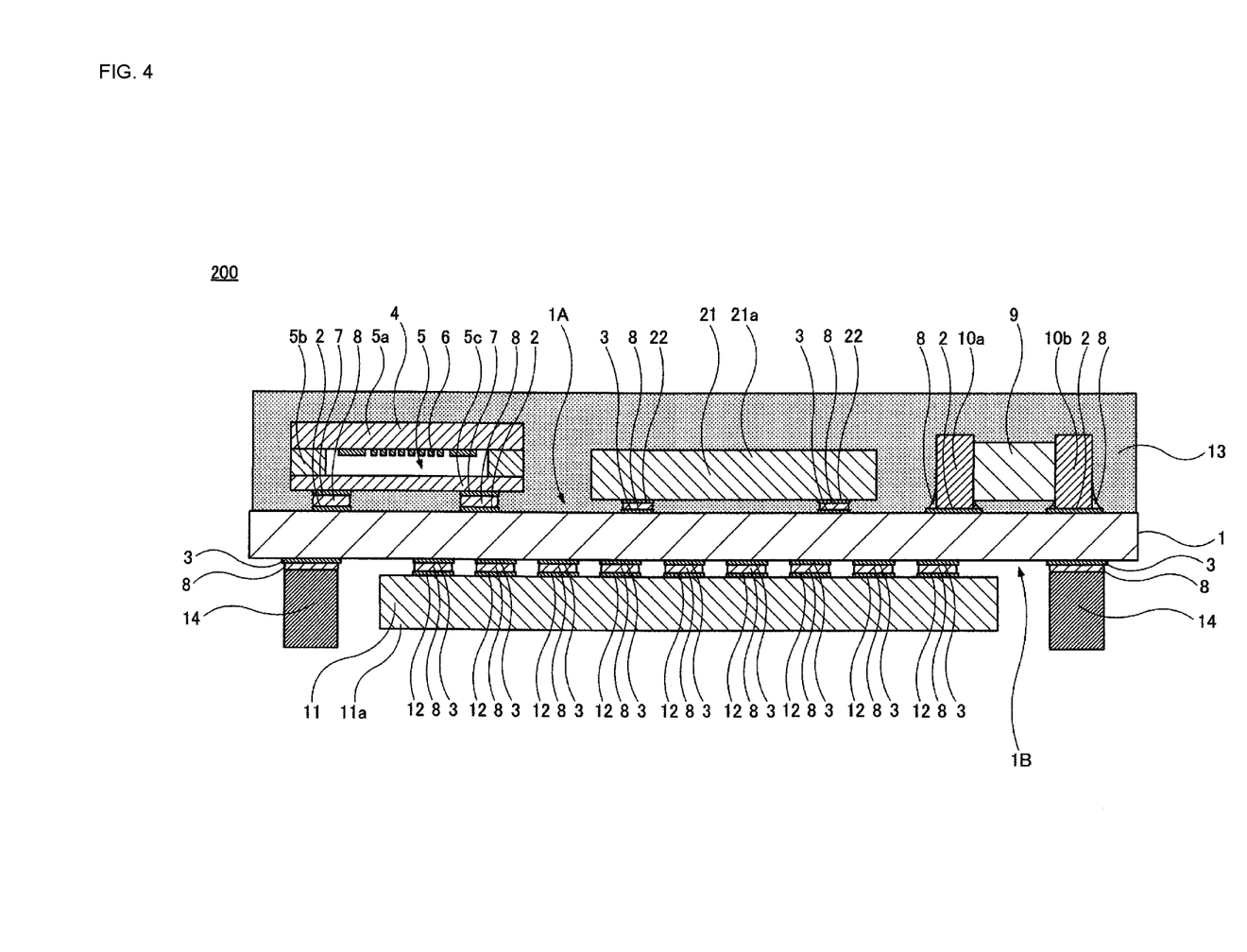
FIG. 4 is a sectional view of an electronic module according to a second preferred embodiment of the present invention.

FIG. 4 illustrates an electronic module 200 according to a second preferred embodiment of the present invention. FIG. 4 is a sectional view of the electronic module 200.

The electronic module 200 includes a modification to the electronic module 100 according to the first preferred embodiment. Specifically, the electronic module 200 includes a second electronic component 21 substituted for one of the first electronic components 4, although, in the electronic module 100, the two first electronic components 4 each of which includes the hollow portion 5 and the second electronic component 9 that includes no hollow portion are mounted on the first main surface 1A of the substrate 1. The second electronic component 21, together with the first electronic component 4 and the second electronic component 9, is sealed with the sealing resin 13. The main body (not illustrated) of the second electronic component 21 is sealed with an exterior resin 21a.

The second electronic component 21 is preferably a semiconductor device, and electrodes 22 are provided on the mounting surface as with the second electronic component 11. However, the pitch between the electrodes 22 that are provided on the mounting surface of the second electronic component 21 is wider than in the second electronic component 11 and are preferably, for example, about 0.3 mm.

Even when the sealing resin 13 that has low liquidity when uncured seals the second electronic component 21, the space between the electrodes 22 is sufficiently filled with the sealing resin 13, and no gap is provided therein because the pitch between the electrodes 22 is wide.

The sealing resin 13 that has low liquidity when uncured is able to seal a second electronic component that is mounted on the first main surface 1A of the substrate 1 provided that the pitch between electrodes that are provided on the mounting surface is sufficiently wide as with the second electronic component 21.

Third Preferred Embodiment

Figure 5:
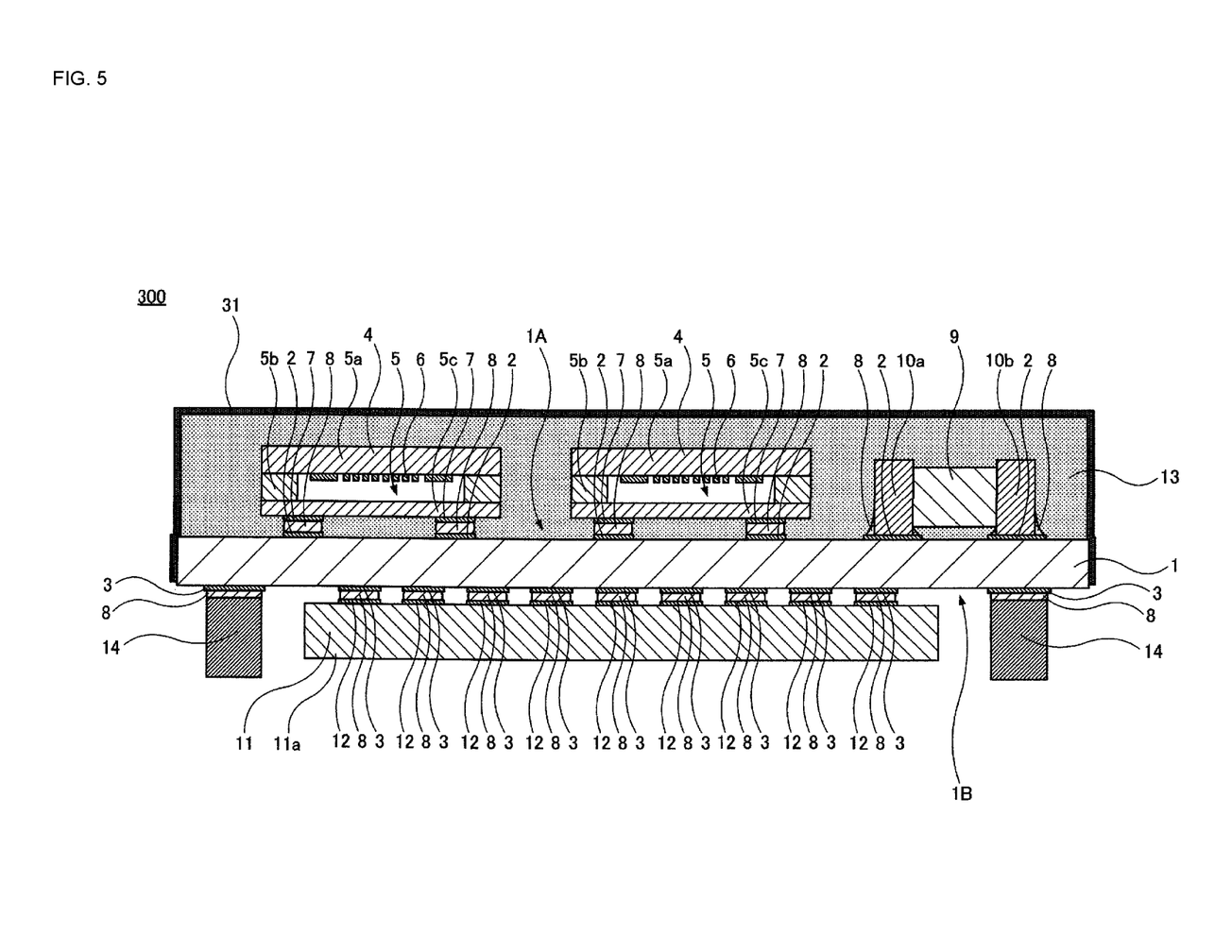
FIG. 5 is a sectional view of an electronic module according to a third preferred embodiment of the present invention.

FIG. 5 illustrates an electronic module 300 according to a third preferred embodiment of the present invention. FIG. 5 is a sectional view of the electronic module 300.

The electronic module 300 differs from the electronic module 100 according to the first preferred embodiment in that it includes an additional structure. Specifically, the electronic module 300 includes a shield electrode 31 that is provided on all outer surfaces of the sealing resin 13 of the electronic module 100 and four edge surfaces of the substrate 1. The material and structure of the shield electrode 31 are not limited. For example, the shield electrode 31 may preferably have a three-layer structure including, for example, a close-contact layer that is made of Ti, Ni, Cr, or SUS, or an alloy thereof, a conductive layer that is formed of Cu, Al, or Ag, or an alloy thereof, and a corrosion resistance layer that is made of Ti, Ni, or Cr, or an alloy thereof.

The shield electrode 31 of the electronic module 300 prevents the first electronic components 4 and the second electronic component 9 defined by chip components from being adversely affected by noise from the outside. The shield electrode 31 of the electronic module 300 also prevents the first electronic components 4 and the second electronic component 9 from emitting noise to the outside. In addition, the shield electrode 31 of the electronic module 300 prevents water from entering the inside of the sealing resin 13, and accordingly, the humidity resistance of the hollow portion 5 of each first electronic component 4 is further improved.

The electronic modules 100, 200, and 300 according to the first preferred embodiment to the third preferred embodiment are described above. The present invention, however, is not limited to the above-described preferred embodiments, and various modifications may be made within the scope of the present invention.

For example, the type of resin base material is not limited, and a silicone resin, for example, may be used instead of an epoxy resin, although an epoxy resin is preferably used as the base materials of the sealing resins 13 of the electronic modules 100, 200, and 300.

The material of the filler is not limited, and alumina, boron nitride, or a composite material thereof, for example, may be used instead of silica, although powder of silica is preferably used as the fillers of the sealing resins 13 of the electronic modules 100, 200, and 300. The sealing resin 13 may not include the filler and may be a fillerless resin in the case in which the base material of the sealing resin 13 has sufficiently low liquidity when uncured.

The type of each first electronic component 4 is not limited, and another type of the first electronic component may be used instead of an elastic wave device, although elastic wave devices are preferably used as the first electronic components 4, each of which includes the hollow portion 5, of the electronic modules 100, 200, and 300.

The type of the second electronic component 11 is not limited, and another type of the second electronic component may be used instead of a semiconductor device, although semiconductor devices are preferably used as the second electronic components 11, each of which has no hollow portion, of the electronic modules 100, 200, and 300.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electronic module comprising:
   a substrate that includes a first main surface and a second main surface;
   electrodes that are provided on the second main surface of the substrate;
   at least one first electronic component that includes electrodes provided on a mounting surface thereof on the substrate and that includes a hollow portion;

at least one second electronic component that includes electrodes provided on a mounting surface thereof on the substrate and that includes no hollow portion; and
a sealing resin; wherein
the at least one first electronic component is mounted on the first main surface of the substrate and sealed with the sealing resin;
the at least one second electronic component has a narrowest pitch between the electrodes provided on the mounting surface thereof when compared with any other second electronic components, and is mounted on the second main surface of the substrate; and
the electrodes provided on the second main surface of the substrate and the electrodes of the at least one second electronic component that join the at least one second electronic component to the substrate are not sealed with sealing resin.

2. The electronic module according to claim 1, wherein the sealing resin includes a filler.

3. The electronic module according to claim 1, wherein an outer electrode that is defined by a metal piece is mounted on the second main surface of the substrate.

4. The electronic module according to claim 1, wherein the at least one first electronic component is an elastic wave device.

5. The electronic module according to claim 1, wherein the at least one second electronic component that has the narrowest pitch between the electrodes on the mounting surface includes an exterior resin that defines outer surfaces thereof.

6. The electronic module according to claim 1, wherein the at least one second electronic component that has the narrowest pitch between the electrodes on the mounting surface is a semiconductor device.

7. The electronic module according to claim 1, wherein a shield electrode is provided on at least a portion of an outer surface of the sealing resin.

8. The electronic module according to claim 1, wherein the substrate is a resin substrate.

9. The electronic module according to claim 8, wherein the resin substrate is made of polychlorinated biphenyl.

10. The electronic module according to claim 1, wherein the substrate is a ceramic substrate.

11. The electronic module according to claim 10, wherein the ceramic substrate is made of low temperature co-fired ceramics.

12. The electronic module according to claim 1, wherein the electrodes of the at least one first electronic component are made of Cu or Ni.

13. The electronic module according to claim 1, wherein the sealing resin does not include filler.

14. The electronic module according to claim 1, wherein the narrowest pitch between the electrodes of the at least one second electronic component is about 0.3 mm.

15. The electronic module according to claim 1, wherein the at least one first electronic component and the at least one second electronic component are chip components.

16. The electronic module according to claim 1, wherein the sealing resin is an epoxy resin defining a base material.

17. The electronic module according to claim 16, wherein the sealing resin includes silica powder defining a filler.

18. The electronic module according to claim 17, wherein the silica powder has an average particle diameter of about 30 μm in an amount of about 80% by volume.

19. The electronic module according to claim 1, wherein the electrodes provided on the second main surface of the substrate are joined to the electrodes of the at least one second electronic component by a solder or a conductive adhesive.

* * * * *